United States Patent
Yaw et al.

(10) Patent No.: US 7,230,280 B2
(45) Date of Patent: Jun. 12, 2007

(54) COLLIMATING LIGHT FROM AN LED DEVICE

(75) Inventors: Yean Chon Yaw, Perak (MY); Yi Feng Hwang, Perak (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 10/855,304

(22) Filed: May 27, 2004

(65) Prior Publication Data

US 2005/0263784 A1  Dec. 1, 2005

(51) Int. Cl.
  *H10L 29/41* (2006.01)
  *H10L 29/06* (2006.01)

(52) U.S. Cl. ............................ 257/98; 257/99; 257/666

(58) Field of Classification Search ................ 257/98, 257/99, 666
See application file for complete search history.

(56) References Cited

U.S. PATENT DOCUMENTS

| | | | | |
|---|---|---|---|---|
| 4,633,582 A * | 1/1987 | Ching et al. | ................... | 29/827 |
| 4,698,730 A * | 10/1987 | Sakai et al. | ................... | 362/311 |
| 5,384,471 A * | 1/1995 | Schairer et al. | ................ | 257/98 |
| 5,418,384 A * | 5/1995 | Yamana et al. | ................ | 257/88 |
| 5,623,181 A * | 4/1997 | Suehiro et al. | .............. | 313/512 |
| 5,719,434 A * | 2/1998 | Levine et al. | ................. | 257/666 |
| 5,793,062 A * | 8/1998 | Kish et al. | ..................... | 257/98 |
| 5,924,785 A * | 7/1999 | Zhang et al. | ................ | 362/241 |
| 6,274,890 B1 * | 8/2001 | Oshio et al. | ................... | 257/98 |
| 6,521,916 B2 * | 2/2003 | Roberts et al. | ............. | 257/100 |
| 6,552,368 B2 * | 4/2003 | Tamai et al. | ................... | 257/98 |
| 6,641,287 B2 * | 11/2003 | Suehiro | ....................... | 362/298 |
| 6,674,096 B2 * | 1/2004 | Sommers | ..................... | 257/98 |
| 6,727,643 B2 * | 4/2004 | Suehiro | ....................... | 313/499 |
| 6,831,305 B2 * | 12/2004 | Yasukawa et al. | ............ | 257/99 |
| 6,841,804 B1 * | 1/2005 | Chen et al. | .................... | 257/98 |
| 2001/0024087 A1 * | 9/2001 | Suehiro et al. | ............. | 313/512 |
| 2002/0084462 A1 * | 7/2002 | Tamai et al. | ................... | 257/79 |
| 2002/0101157 A1 * | 8/2002 | Suehiro | ....................... | 313/512 |
| 2003/0185005 A1 * | 10/2003 | Sommers et al. | ........... | 362/240 |
| 2004/0042212 A1 * | 3/2004 | Du et al. | ..................... | 362/296 |

FOREIGN PATENT DOCUMENTS

JP    10144966 A * 5/1998

OTHER PUBLICATIONS

Suehiro et al, Computerized translation if item N on this Form PTO-892 fromn Patents Abstracts of Japan (May 1998).*
http://oregano.zianet.com/happypenguin/pics/vla/single_dish2.jpg (Picture of VLA).*
http://www.sheltoweehikes.com/photogallery/New%20Mexico/j43%20VLA%204.jpg (Picture of VLA).*

(Continued)

*Primary Examiner*—Jack Keith
*Assistant Examiner*—Ari M. Diacou

(57) ABSTRACT

A technique for collimating light from a Light Emitting Diode (LED) device involves emitting light from an LED die, collimating the light with a parabolic reflector, and further collimating the light with a lens. A device constructed according to the technique includes an LED die, a lens for collimating light, and a parabolic reflector for collimating light from the LED die toward the lens.

10 Claims, 8 Drawing Sheets

OTHER PUBLICATIONS http://www.sheltoweehikes.com/photogallery/New%20Mexico/j42%20VLA%203.jpg (Picture of VLA).* http://cfa-www.harvard.edu/dawn/photos/vla.vhf.cell.phone.bars.JPG (Picture of VLA).* http://cfa.www.harvard.edu/dawn/photos/vla.vhf.dish.subrefl.4.2.p.full.jpg (Picture of VLA).* http://cfa-www.harvard.edu/dawn/photos/vla.vhf.inside.dish.JPG (Picture of VLA).* http://cfa-www.harvard.edu/dawn/photos/vla.vhf.dish.subrefl.4.2.p.full.jpg (Marked-up by examiner to indicate structural elements).*

Very Large Array. From Wikipedia, the free encyclopedia. Revision as of 20:51, Aug. 6, 2006; http://en.wikipedia.org/w/index.php?title=Very_Large_Array&oldid=68065396&printable=yes DL: Aug. 19, 2006 6:31:01 PM.*

* cited by examiner

COLLIMATING LIGHT FROM AN LED DEVICE

BACKGROUND OF THE INVENTION

Light Emitting Diodes (LEDs) are widely used in applications such as Liquid Crystal Display (LCD) back lighting, commercial-freezer lighting, white light illumination, etc. LEDs are typically available in through-hole and Surface Mount Technology (SMT) packages. Through-hole packages are ideal for wave solder board applications. Such through-hole LEDs are typically manufactured with a leadframe having two leads. SMT packages are best used with reflow assembly. SMT devices are also useful when package size constraints are an issue. SMT devices are typically manufactured with a leadframe, or a Printed Circuit Board (PCB) or ceramics substrate.

Some applications, such as stage lighting and automotive lighting, often call for spot lighting or narrow viewing angle light—for example, the desired area of illumination may be 5–20 meters away from the light source and the area to be illuminated may be 1–3 meters in diameter (or width). The divergence of a beam can be calculated using the following trigonometric formula:

$$2 \times H \times \tan(\theta/2),$$

where H represents the distance of the light source to the area of illumination and $\theta$ represents the viewing angle. The narrowest viewing angle for currently available LEDs is about 15°. The following table, entitled Beam Size for Various Narrow Angle LED Packages, shows the divergence of light from currently available LEDs with viewing angles of 15°, 30°, and 45°.

TABLE

Beam Size for Various Narrow Angle LED Packages

| Viewing angle of LED package | Beam size at the following distances (in meters) | | | |
| --- | --- | --- | --- | --- |
| | 5 m | 10 m | 20 m | 30 m |
| 15° | 1.30 | 2.60 | 5.20 | 7.80 |
| 30° | 2.68 | 5.36 | 10.72 | 16.08 |
| 45° | 4.14 | 8.28 | 16.57 | 24.85 |

As is apparent from the table, even LEDs with the narrowest viewing angles may not meet the objectives of some spot lighting applications.

Collimating light from an LED typically decreases (i.e., makes narrower) the effective viewing angle of the LED. Unfortunately, there are several obstacles to collimating light from LEDs. One such obstacle arises from the fact that an LED die does not provide a perfect point source. A typical LED die dimension is about 250 μm×250 μm (10 mils×10 mils) with an active junction area of about 250 μm×250 μm. Light can originate from any point of the active junction area. Accordingly, it is virtually impossible to ensure that light emitted from an LED die is at a focal point of a lens or reflector.

Another obstacle to collimating light from an LED arises from the fact that LED light, though it may appear to be, is not monochromatic. Photons of different wavelengths have differing indices of refraction. Accordingly, light passing from an LED die through a lens is refracted at different angles according to wavelength. The change of index of refraction according to wavelength is known in the art of optics as chromatic dispersion. Chromatic dispersion is the phenomenon that causes the separation of colors in a prism.

SUMMARY OF THE INVENTION

A technique for collimating light from a Light Emitting Diode (LED) device involves emitting light from an LED die, collimating the light with a parabolic reflector, and further collimating the light with a lens. A device constructed according to the technique includes an LED die, a lens for collimating light, and a parabolic reflector for collimating light from the LED die toward the lens.

BRIEF DESCRIPTION OF THE DRAWINGS

Throughout the description, similar reference numbers may be used to identify similar elements.

DETAILED DESCRIPTION OF THE INVENTION

A technique for collimating light from a Light Emitting Diode (LED) device involves emitting light from an LED die, collimating the light with a parabolic reflector, and further collimating the light with a lens. The LED die may rest on a die pad of a leadframe between the parabolic reflector and the lens. Collimating light first with the parabolic reflector results in light output with a narrower viewing angle than could be achieved with the lens alone. Moreover, collimating light first with the parabolic reflector reduces chromatic dispersion when collimating light with the lens. However, since the leadframe is between the parabolic reflector and the lens, light reflected from the parabolic reflector toward the lens may be blocked by the leadframe. To reduce the amount of reflected light that is blocked by the leadframe, the leadframe has a narrow optical profile (e.g., an I-beam configuration).

Figure 1:
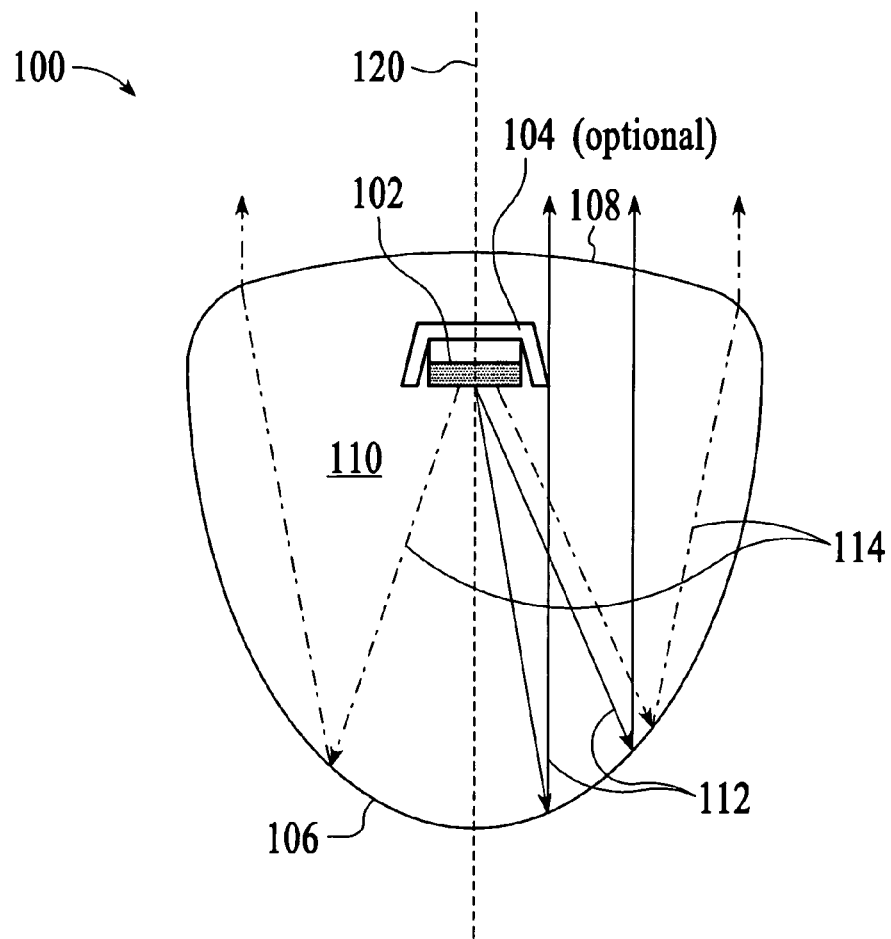
FIG. 1 depicts a Light Emitting Diode (LED) device according to an embodiment of the invention.

FIG. 1 depicts an LED device 100 according to an embodiment of the invention. The LED device 100 includes an LED die 102, an optional reflector cup 104, a parabolic reflector 106, and a lens 108. The LED die 102 and reflector cup 104 are enclosed within an encapsulant 110. The parabolic reflector 106 and the lens 108 are formed on, or are part of, the encapsulant 110. The parabolic reflector 106 has a center axis 120. The three optical elements—reflector cup 104, parabolic reflector 106, and lens 108—are designed according to desired LED light output.

The LED die 102 is typically a small square of semi-conducting material, referred to in the art of semi-conductor manufacture as a die or chip, that is the "active" light emitting component of an LED device. The LED die 102 emits light when a charge is applied to the LED die 102. One technique for applying charge to the LED die 102 is described later with reference to FIGS. 2A and 2B.

The reflector cup 104 is an optional optical element in the LED device 100. The reflector cup 104 serves to reflect light from the LED die 102 toward the parabolic reflector 106. One advantage of the reflector cup 104 is that the reflector cup 104 can reduce or eliminate side emissions (not shown). Moreover, the reflector cup 104 may reflect light incident on the reflector cup 104 toward the parabolic reflector 106. In this way, the reflector cup 104 collimates light in a direction radiating outward from the concave portion of the reflector cup 104. The reflector cup 104 may be an extension of a leadframe, as discussed later with reference to FIGS. 2A and 2B.

Figure 8:
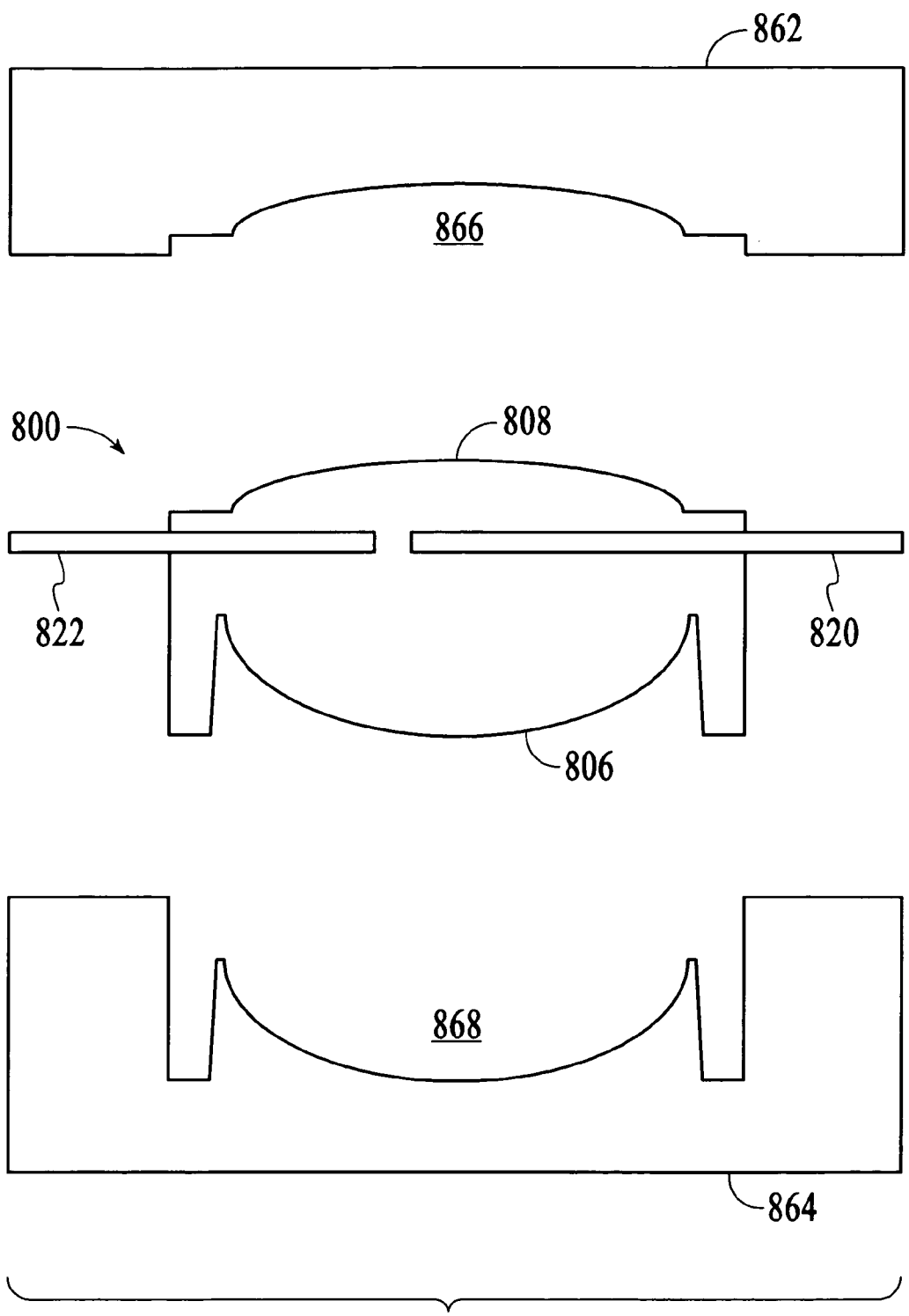
FIG. 8 depicts exemplary molds for shaping a lens and a parabolic surface of an LED device.

The encapsulant 110 may be of an epoxy material transfer molded to an Optical Precision Mold (OPM). The OPM can be formed to high precision with commercially available cutting and Electrical Discharge Machining (EDM) technology. The use of ray tracing software and laboratory prototyping can assist in light output analysis since OPM is an expensive tool. The epoxy material is typically transparent and is cured to a solid form after molding. Accordingly, when the encapsulant 110 includes epoxy, light efficiently passes through the encapsulant 110 from the LED die 102. Moreover, the epoxy protects the LED die 102 and other components (e.g., a wire bond), forming a monolithic structure around the LED die 102 and other components. To create the lens 108 and parabolic surface for the parabolic reflector 108, the OPM may be fabricated with mold cavities on the top and bottom. FIG. 8 depicts exemplary molds 862 and 864 for shaping a lens 808 and a parabolic surface 806 of an LED device 800. The upper mold 862 includes a mold cavity 866 that shapes the lens 808 and the lower mold 864 includes a mold cavity 868 that shapes the parabolic surface 806. For illustrative purposes, FIG. 8 also depicts the cathode 820 and anode 822 of a leadframe.

Since epoxy is typically transparent, the parabolic surface of the encapsulant 110 can be treated or transformed into a reflective material to create the parabolic reflector 106. The method or materials used to form the reflective surface of the parabolic reflector 106 are not critical. Two exemplary methods of coating the parabolic surface of the encapsulant 110 with reflective material are vacuum metallization and vapor deposition of metallic material onto the parabolic surface. These methods work well because the coating is adhesive and has been proven effective in reliability testing. The coating process can be carried out before the sawing or singulation of the LED device 100 to improve productivity.

The parabolic reflector 106 is an optical element formed in the approximate shape of a paraboloid of revolution. The parabolic reflector 106 functions due to the geometric properties of the paraboloid shape: if the angle of incidence to the parabolic reflector 106 equals the angle of reflection, then any incoming light that is parallel to the center axis 120 of the parabolic reflector 106 will be reflected to a central point, or "focus." Similarly, light radiating from the focus to the parabolic reflector 106 is reflected outward in a beam that is parallel to the axis 120 of the parabolic reflector. The axis of a parabola and the focus of a parabola are well-known in mathematics. It should be noted that the parabolic reflector 106 need not have a perfect paraboloid shape, but should have a tendency to collimate light along a central axis.

The lens 108 is an optical element that collimates light received from the parabolic reflector 106. The methods and materials used to craft the lens 108 are not critical. The lens 108 may be formed into the encapsulant 110. The lens 108 is configured to refract the light 114 that is not parallel to the axis 120 of the parabolic reflector 106, while allowing the light 112 that is parallel to the center axis 120 to pass through the lens 108 unrefracted. In this way, the light 112 and the light 114 that exits the LED device 100 is collimated parallel to the axis 120 of the parabolic reflector 106.

In operation, light 112 and 114 is emitted from the LED die 102, the reflector cup 104 reduces side emissions of light (not shown) from the LED die 102, and the parabolic reflector 106 reflects the light 112 and 114 toward the lens 108 and out of the LED device 100. The operation of the LED device 100 is described in detail, particularly with respect to the three optical elements—reflector cup 104, parabolic reflector 106, and lens 108—as follows.

The reflector cup 104 improves the efficiency of the LED device 100 by reducing side emissions of light from the LED die 102. The reflector cup 104 may be configured to collimate light. In this case, light from the LED die 102 that is incident on the reflector cup 104 may be directed toward the parabolic reflector 106.

The parabolic reflector 106 collimates the light 112 and 114. As is well-known in the art of optics, a parabolic reflector has a focal point on the axis of the parabolic reflector. The parabolic reflector reflects light received from the focal point parallel to the axis. As depicted in FIG. 1 for the purposes of example, the light 112 that is emitted from the LED die 102 intersects the focal point of the parabolic reflector 106. Accordingly, the parabolic reflector 106 collimates the light 112 parallel to the axis 120. As is well-known in the art of optics, a parabolic reflector reflects light that does not intersect the focal point non-parallel to the axis. As depicted in FIG. 1 for the purposes of example, the light 114 that is emitted from the LED die 102 does not intersect the focal point of the parabolic reflector 106. Accordingly, the parabolic reflector 106 does not reflect the light 114 parallel to the axis 120. It should be noted, however, that the parabolic reflector 106 typically collimates the light 114 (e.g., the light 114 is closer to parallel with the axis 120 after the parabolic reflector 106 reflects the light than before). Therefore, even if none of the light 114 intersects the focal point of the parabolic reflector 106, the reflected light may typically be referred to as collimated.

The lens 108 further collimates the light 112 and 114. Ideally, the light 112 that is parallel to the axis 120 of the parabolic reflector 106 passes through the lens 108 without being refracted and the light 114 that is not parallel to the axis 120 is refracted to be parallel to the axis 120.

Figure 2A:
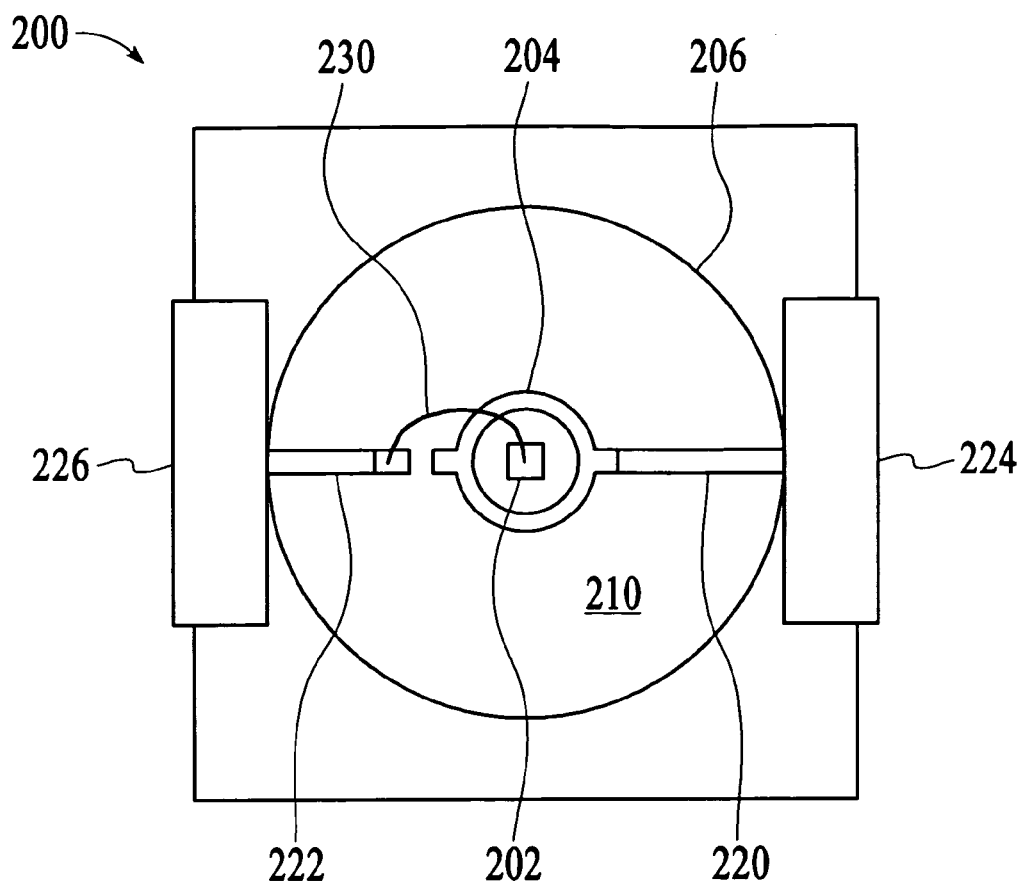
FIGS. 2A and 2B depict bottom and side perspective views of an LED device according to an embodiment of the invention.
Figure 2B:
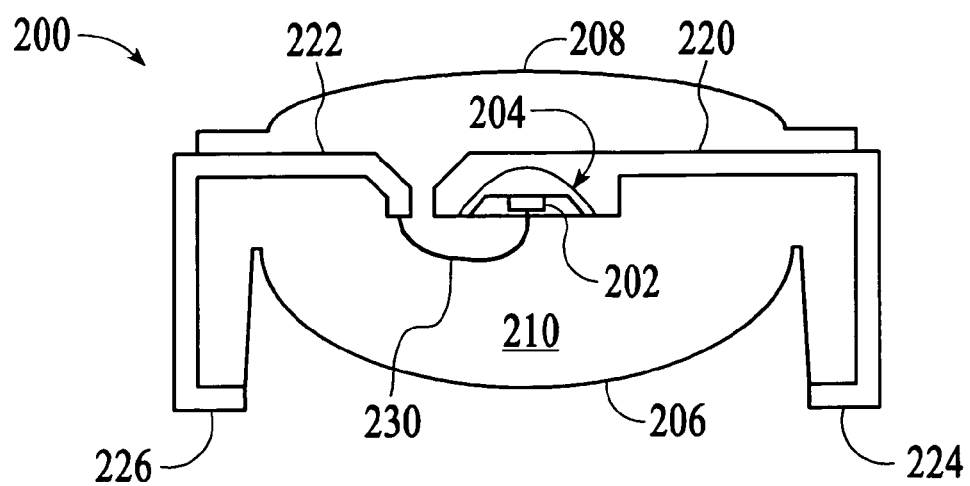

FIGS. 2A and 2B depict bottom and side perspective views of an LED device 200 according to an embodiment of the invention. The LED device 200 is similar to the LED device 100 (FIG. 1), and includes an LED die 202, reflector cup 204, parabolic reflector 206, lens 208, and encapsulant 210. Unlike in FIG. 1, however, a wire 230 and a leadframe are depicted in FIG. 2. The leadframe includes a cathode 220, an anode 222, a cathode soldering terminal 224, and an anode soldering terminal 226. A leadframe is typically a metallic frame that functions as an electrical conduit for an LED die. The leadframe consisting of an array of cathode and anode posts can be mass manufactured from stamping, etching, or a combined process.

The reflector cup 204 may be part of or attached to the cathode 220. The LED die 202 is inside the reflector cup 204 and connected to the cathode 220. The wire 230 connects the LED die 202 to the anode 222, completing a circuit. As is well-known in the art of electronics, such a circuit, when appropriately configured, can allow charge to be applied to the LED die 202 such that the LED die 202 emits light. The LED die 202, reflector cup 204, cathode 220, anode 222, and wire 230 are enclosed in the encapsulant 210. The LED device 200 is typically soldered to, for example, a leadframe, a printed circuit board, or a flexible circuit at the cathode soldering terminal 224 and the anode soldering terminal 226. Soldering LED devices to leadframes, printed circuit boards, and flexible circuits is well-known in the art of electronics.

It should be noted that although FIGS. 2A and 2B depict a Surface Mount Technology (SMT) device, a through-hole device with leads protruding out like a Dual In-line Package (DIP) can be made by modifying the leads and bending the leads downward.

FIGS. 3A, 3B, 3C, and 3D depict part of an I-beam leadframe for use with the LED device of FIGS. 2A and 2B. The leadframe includes a cathode 320. For illustrative purposes, a reflector cup 304 is connected to the cathode 320 and an LED die 302 is inside the reflector cup 304. The cathode has a height dimension 342 and a width dimension 344. The height dimension 342 should be kept relatively large compared to the width dimension 344. The relatively large height dimension 342 provides structural support to the LED die 302. In addition, the leadframe serves as a thermal path. As is well-known in the art of electronics, heat transfer efficiency increases as a function of increase in thermal path area. Accordingly, the relatively large height dimension 342 facilitates heat dissipation. The relatively small width dimension 344, accords the leadframe a narrow optical profile. Thus, the leadframe obstructs less light that passes parallel to the height of the leadframe.

Figure 3A:
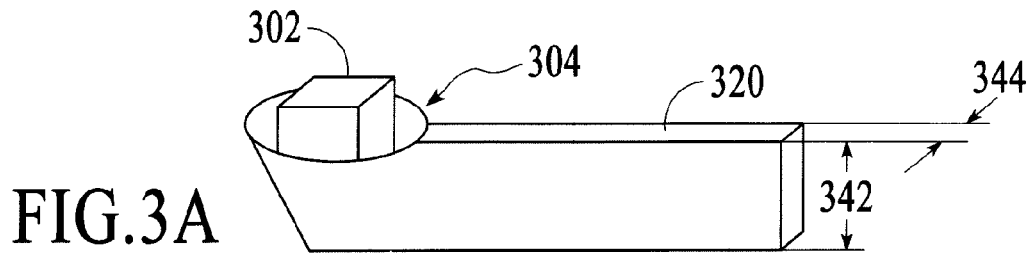
FIGS. 3A, 3B, 3C, and 3D depict part of an I-beam leadframe for use with the LED device of FIGS. 2A and 2B.
Figure 3B:
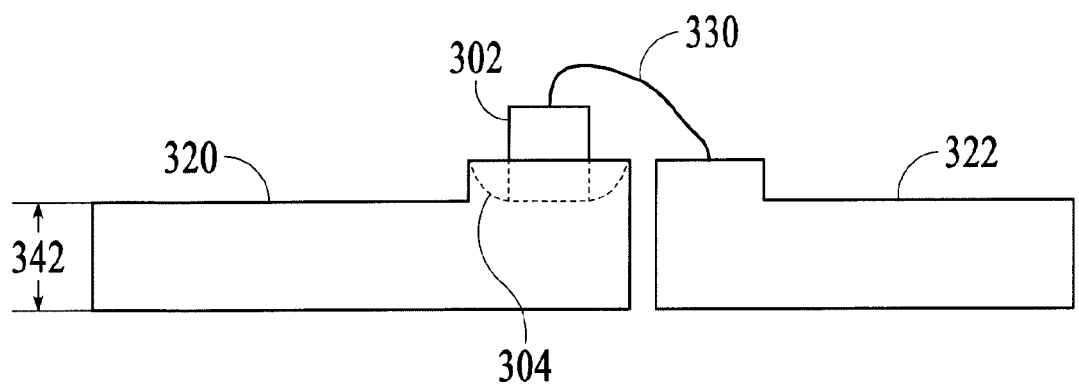
Figure 3C:
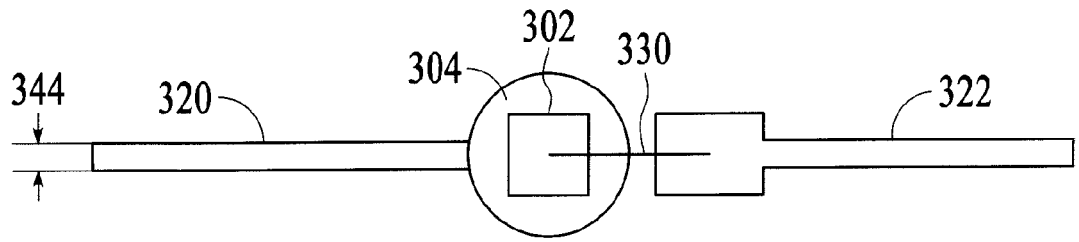

FIGS. 3B and 3C depict side and top perspective views of part of the I-beam leadframe. For illustrative purposes, FIGS. 3B and 3C include an anode 322 and a wire 320.

Figure 3D:
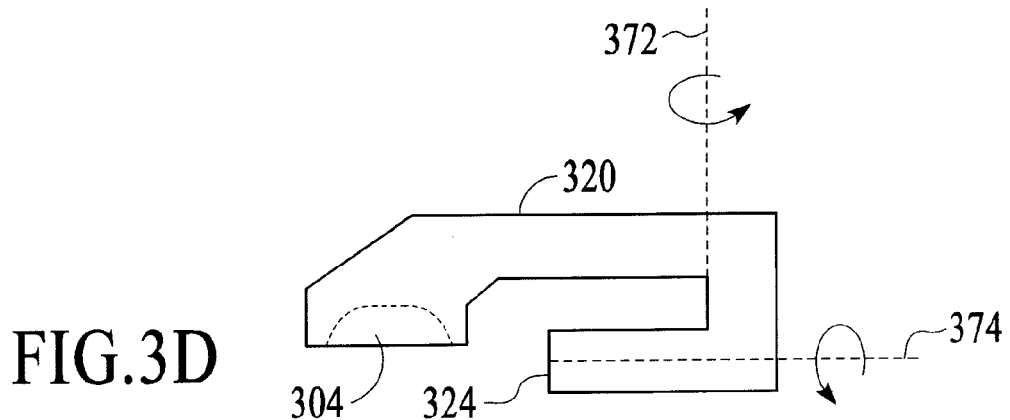

FIG. 3D depicts the cathode 320 of the leadframe and directions of formation of the cathode 320 and cathode soldering terminal 324. Due to the I-beam structure of the reflector cup 304, the design of the leadframe requires two-direction formation. FIG. 3D depicts the first direction of formation 372 and the second direction of formation 374. Since two-direction formation is more complicated than one-direction formation, the leadframe design may omit the reflector cup 304, as described with reference to FIGS. 4A and 4B.

Figure 4A:
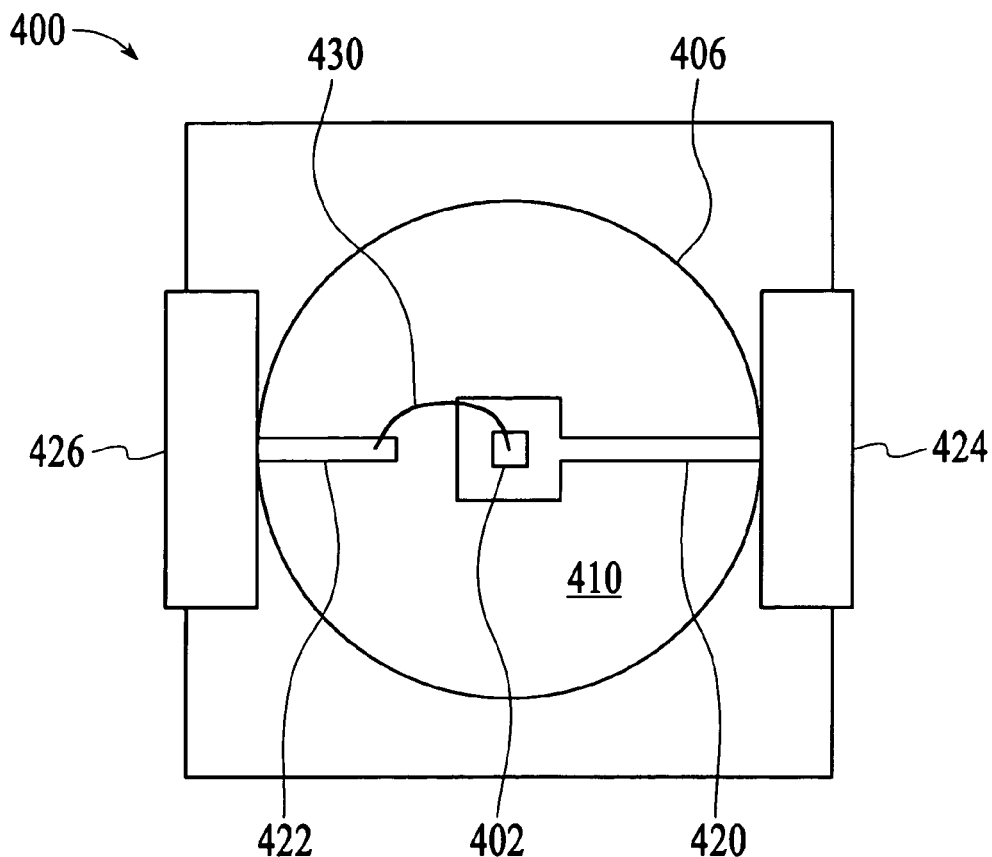
FIGS. 4A and 4B depict bottom and side perspective views of an LED device according to an embodiment of the invention.
Figure 4B:
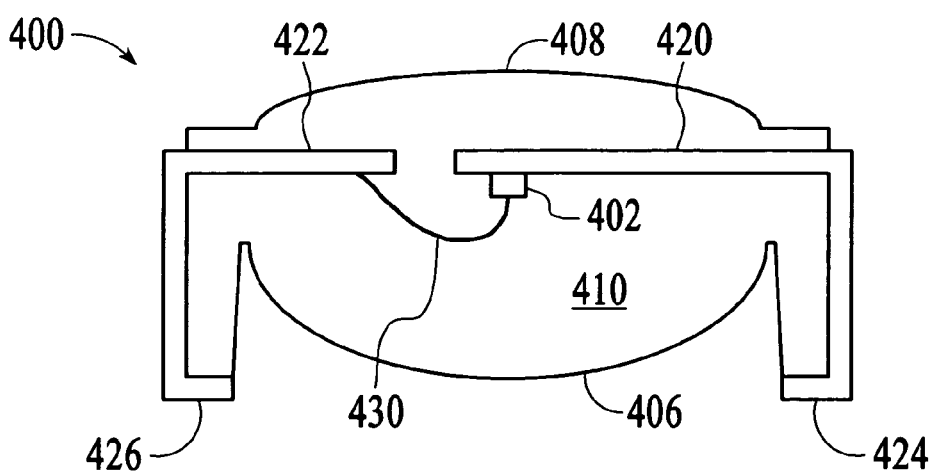

FIGS. 4A and 4B depict bottom and side perspective views of an LED device 400 according to an embodiment of the invention. FIGS. 4A and 4B are similar to FIGS. 2A and 2B, but the optional reflector cup 204 is omitted. Excluding the reflector cup 204 facilitates the trim and form of the leadframe. With reference to FIG. 3A, due to the I-beam structure of the reflector cup 304, the design of the leadframe is complicated and requires two-direction formation. Without the reflector cup 304, as depicted in FIGS. 4A and 4B, the leadframe is a flat sheet and requires only one direction of forming to form the soldering terminals 424 and 426.

In an alternative, the LED die 402 may be located within a non-reflective cavity (not shown) of the cathode 420. In this case, the non-reflective cavity would serve to reduce side emissions of light emitted from the LED die 402.

Figure 5A:
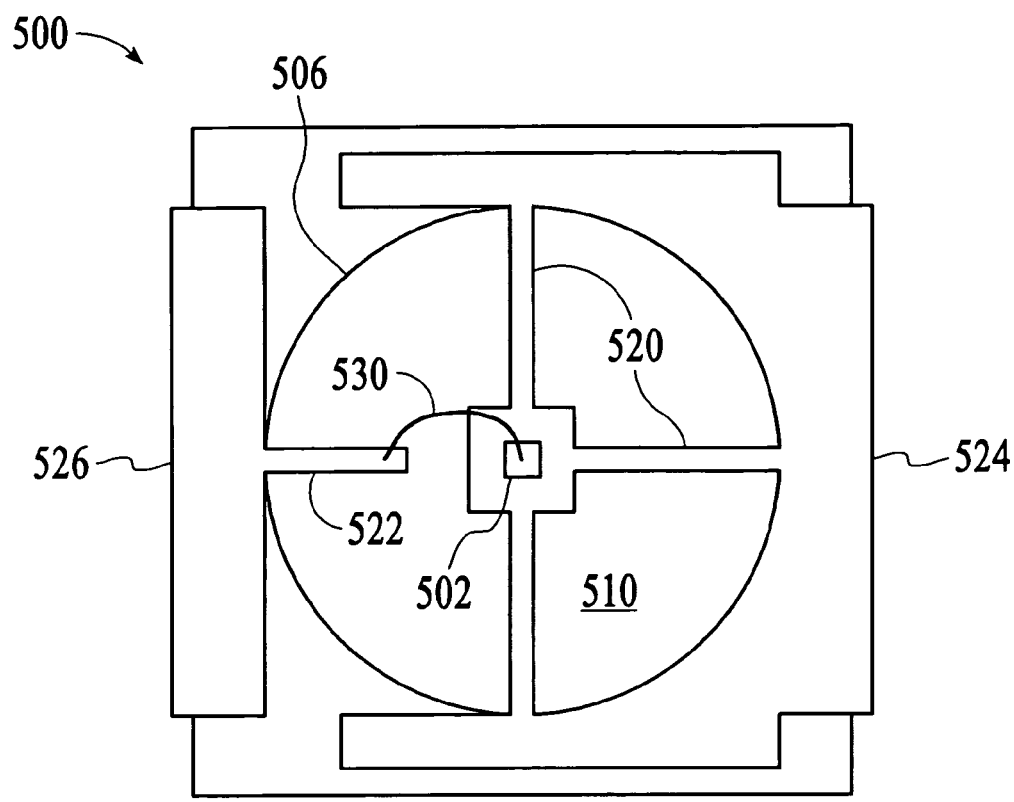
FIGS. 5A and 5B depict bottom and side perspective views of an LED device according to an embodiment of the invention.
Figure 5B:
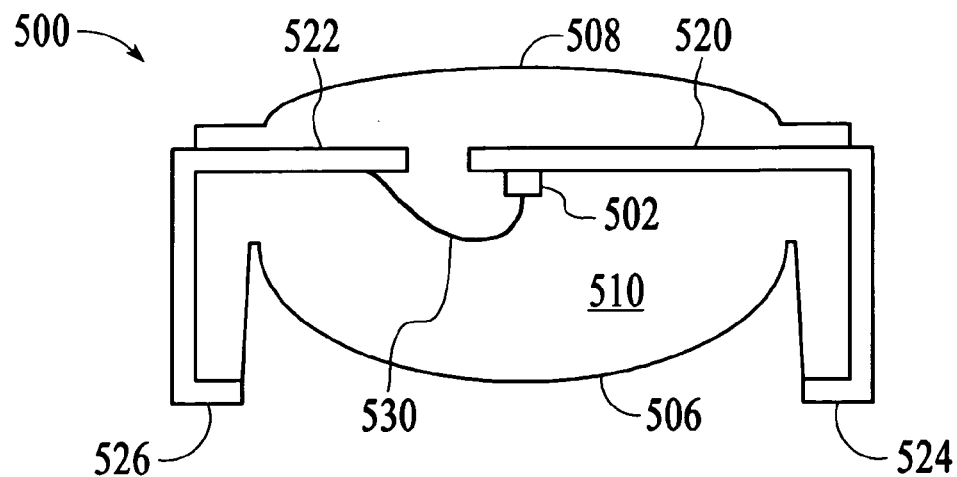

FIGS. 5A and 5B depict bottom and side perspective views of an LED device 500 according to an embodiment of the invention. The LED device 500 is similar to the LED device 400, but the cathode 520 is a multi-prong cathode. It should be noted that the anode 522 could be similarly configured as a multi-prong anode, though the anode 522 is not so depicted in FIGS. 5A and 5B. The multi-prong cathode provides improved heat dissipation and improved thermal conductivity for the LED die 502 because the multiple cathode pads 520 increase thermal path area. Moreover, the multi-prong cathode increases the mechanical strength of the cathode 520, thereby improving mechanical support.

Figure 6A:
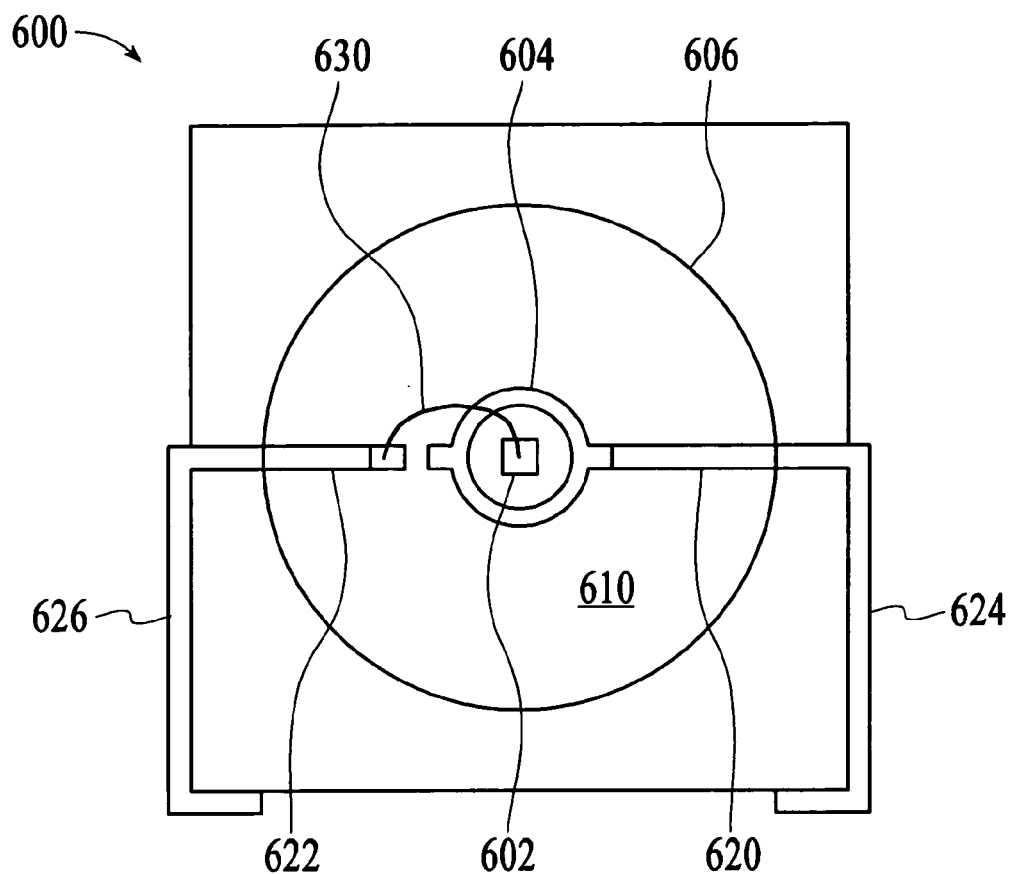
FIGS. 6A and 6B depict bottom and side perspective views of an LED device according to an embodiment of the invention.
Figure 6B:
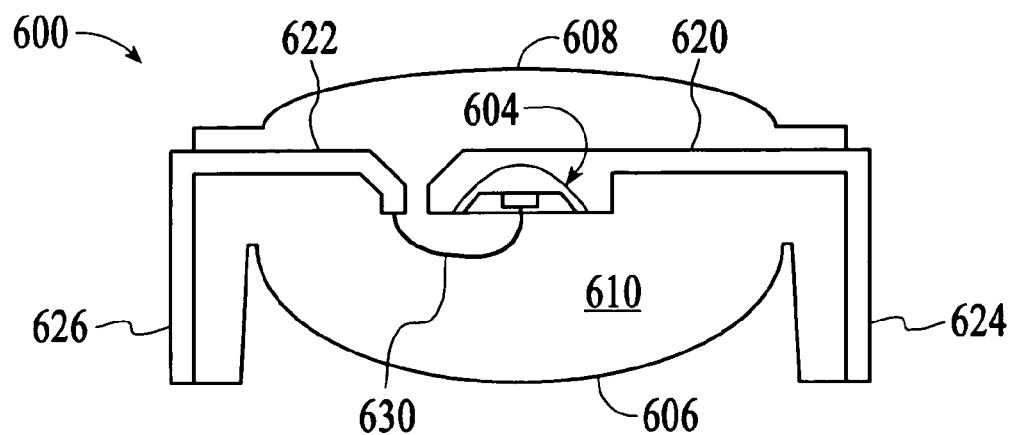

FIGS. 6A and 6B depict bottom and side perspective views of an LED device 600 according to an embodiment of the invention. FIGS. 6A and 6B are intended to illustrate that the LED device 600 can be configured for side-firing.

Figure 7A:
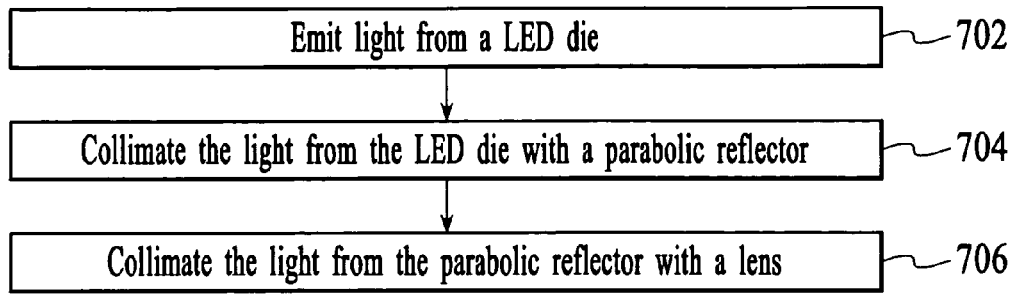
FIGS. 7A, 7B, and 7C are flowcharts of methods according to an embodiment of the invention.
Figure 7B:
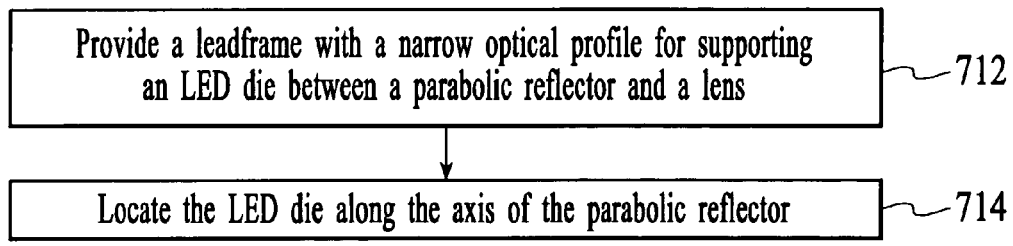
Figure 7C:
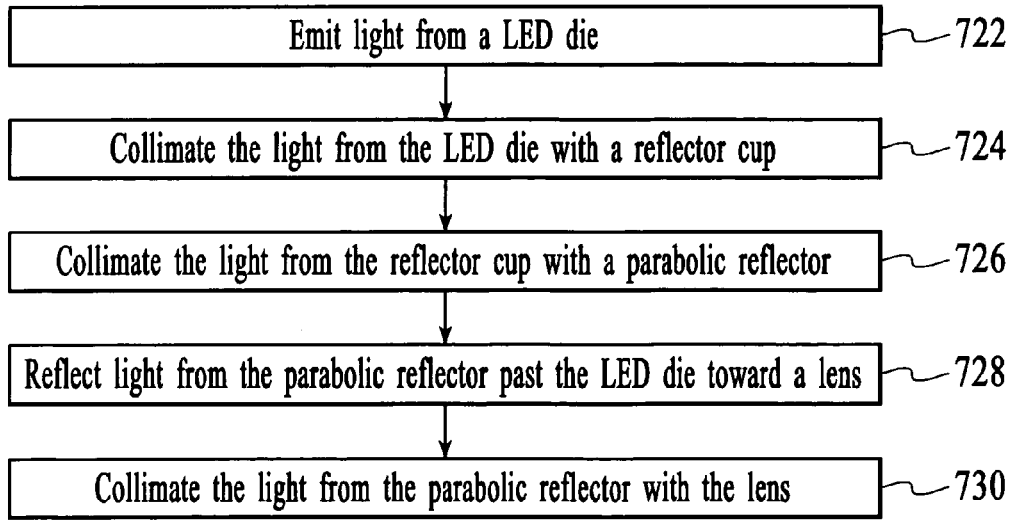

FIGS. 7A, 7B, and 7C are flowcharts of methods according to an embodiment of the invention. The flowchart depicted in FIG. 7A begins at block 702 with emitting light from an LED die. At block 704, the light from the LED die is collimated by a parabolic reflector. At block 706, the light from the parabolic reflector is collimated by a lens. By collimating light first with the parabolic reflector at block 704 and then with the lens at block 706, chromatic dispersion is lessened.

The flowchart depicted in FIG. 7B begins at block 712 with providing a leadframe with a narrow optical profile for supporting an LED die between a parabolic reflector and a lens. At block 714, the LED die is located along the axis of the parabolic reflector.

The flowchart depicted in FIG. 7C is similar to the flowchart depicted in FIG. 7A, but includes extra blocks. The flowchart depicted in FIG. 7C begins at block 722 with emitting light from an LED die. At block 724, the light from the LED die is collimated by a reflector cup. At block 726, the light from the reflector cup is collimated by a parabolic reflector. At block 728, the light is reflected past the LED die toward a lens. At block 730, the light from the parabolic reflector is collimated by the lens.

The term parabolic reflector, as used herein, refers to any reflector having a tendency to collimate light. Light that is parallel to the axis of the parabolic reflector, as used herein, describes light that is substantially parallel to the axis. Collimated light, as used herein, refers to light having rays that are substantially parallel with respect to one another. Collimating light, as used herein, refers to collimating a subset of light rays from a light source or increasing the degree of parallelism of rays of light with respect to one another.

Although specific embodiments of the invention have been described and illustrated, the invention is not to be limited to the specific forms or arrangements of parts as described and illustrated herein. The invention is limited only by the claims.

What is claimed is:

1. A Light Emitting Diode (LED) device, comprising:
   a monolithic structure;
   an LED die encapsulated within the monolithic structure;
   a lens at one surface of the monolithic structure;
   a parabolic reflector at an outer surface of the monolithic structure that is opposite the lens;
   the lens, the parabolic reflector, and the LED die being configured such that light emitted from the LED die is reflected by the parabolic reflector past the LED die and towards the lens; and
   an I-beam leadframe that is an electrical conduit for the LED die, the I-beam leadframe having a height dimension that is larger than a width dimension, which accords the I-beam leadframe a narrow optical profile relative to light that passes parallel to the height dimension of the I-beam leadframe, the I-beam leadframe being oriented relative to the LED die, the lens, and the parabolic reflector such that light reflected from the parabolic reflector passes the I-beam leadframe parallel to the height dimension of the I-beam leadframe;

wherein the I-beam leadframe includes a cathode having a first bend about a first axis and a second bend about a second axis, wherein the first and second axes are perpendicular to each other.

2. The device of claim 1 wherein the lens and LED die are aligned with the center axis of the parabolic reflector.

3. The device of claim 1 further comprising a multi-prong leadframe, wherein the LED die is connected to the multi-prong leadframe.

4. The device of claim 1 further comprising a reflector cup configured to collimate light from the LED die toward the parabolic reflector.

5. The device of claim 1 wherein the I-beam leadframe is configured for side firing relative to a surface on which the device is mounted.

6. The device of claim 1 wherein the LED die is located within a reflector cup that provides an electrical connection to the LED die and which reflects light from the LEE) towards the parabolic reflector, wherein both the LED die and reflector cup are encapsulated within the monolithic structure.

7. The device of claim 1 wherein the first axis is parallel to the first bend and wherein the second axis is parallel to the second bend.

8. The device of claim 1 wherein the I-beam leadframe further includes an anode having a first bend about a third axis and a second bend about a fourth axis, wherein the third and fourth axes are perpendicular to each other.

9. The device of claim 8 wherein the third axis is parallel to the first bend of the anode and wherein the fourth axis is parallel to the second bend of the anode.

10. The device of claim 8 wherein the first and third axes are parallel to each other and wherein the second and fourth axes are parallel to each other.

* * * * *

UNITED STATES PATENT AND TRADEMARK OFFICE
CERTIFICATE OF CORRECTION

PATENT NO.        : 7,230,280 B2                                  Page 1 of 1
APPLICATION NO.   : 10/855304
DATED             : June 12, 2007
INVENTOR(S)       : Yean Yaw It is certified that error appears in the above-identified patent and that said Letters Patent is hereby corrected as shown below:

On the Title page, Col. 2, (Other Publications) Line 1 - Delete "al," and insert -- al., --.

On the Title page, Col. 2, (Other Publications) Line 1 - Delete "if" and insert -- of --, therefor.

On the Title page, Col. 2, (Other Publications) Line 2 - Delete "fromn" and insert -- from N --.

Col. 8 (Line 1), Delete "LEE)" and insert -- LED --.

Signed and Sealed this

Fifteenth Day of July, 2008

JON W. DUDAS
*Director of the United States Patent and Trademark Office*